United States Patent
Miyahara

(10) Patent No.: US 6,798,794 B2
(45) Date of Patent: Sep. 28, 2004

(54) SEMICONDUCTOR LASER DEVICE, ASTIGMATIC CORRECTION PLATE USED THEREFOR AND METHOD OF ARRANGING THE ASTIGMATIC CORRECTION PLATE

(75) Inventor: Hiroyuki Miyahara, Kanagawa (JP)

(73) Assignee: Sony Corporation (JP)

(*) Notice: Subject to any disclaimer, the term of this patent is extended or adjusted under 35 U.S.C. 154(b) by 29 days.

(21) Appl. No.: 10/298,511

(22) Filed: Nov. 19, 2002

(65) Prior Publication Data

US 2003/0099263 A1 May 29, 2003

(30) Foreign Application Priority Data

Nov. 26, 2001 (JP) ................................ P2001-359655

(51) Int. Cl.[7] .............................. H01S 3/10; H01S 3/08; H01S 5/00
(52) U.S. Cl. ............................. 372/9; 372/23; 372/43; 372/98; 372/108
(58) Field of Search .......................... 372/43, 23, 97, 372/98, 108, 9, 21

(56) References Cited

U.S. PATENT DOCUMENTS

| | | | | |
|---|---|---|---|---|
| 4,577,941 A | * | 3/1986 | Kubota | 359/737 |
| 4,795,244 A | * | 1/1989 | Uehara et al. | 356/401 |
| 4,901,325 A | * | 2/1990 | Kato et al. | 372/44 |
| 5,020,065 A | * | 5/1991 | Tada | 372/44 |
| 5,050,153 A | * | 9/1991 | Lee | 369/112.07 |
| 5,072,114 A | * | 12/1991 | Takada | 250/235 |
| 5,089,861 A | * | 2/1992 | Tanaka et al. | 372/36 |
| 5,296,724 A | * | 3/1994 | Ogata et al. | 257/98 |
| 5,504,350 A | * | 4/1996 | Ortyn | 257/81 |
| 5,550,675 A | * | 8/1996 | Komatsu | 359/514 |
| 5,615,052 A | * | 3/1997 | Doggett | 359/811 |
| 6,314,117 B1 | * | 11/2001 | Heim et al. | 372/43 |

FOREIGN PATENT DOCUMENTS

| | | |
|---|---|---|
| JP | 56-80195 | 7/1981 |
| JP | 60-164381 | 8/1985 |
| JP | 2-253675 | 10/1990 |
| JP | 9-283853 | 10/1997 |
| JP | 10-302289 | 11/1998 |

* cited by examiner

Primary Examiner—Don Wong
Assistant Examiner—James Menefee
(74) Attorney, Agent, or Firm—Rader, Fishman & Grauer PLLC; Ronald P. Kananen

(57) ABSTRACT

Provided are a semiconductor laser device capable of increasing an emission angle of a laser beam, an astigmatic correction plate used therefor and a method of arranging the astigmatic correction plate. In order to correct the astigmatism of a laser beam emitted from a first laser light source or a second laser light source, the astigmatic correction plate is arranged so as to intersect diagonally an optical center line (an optical axis) of the laser beam, and the astigmatic correction plate, the first light source and the second light source are arranged so that an optical axis of the first laser light source coincides with a center line (CL) of an effective diameter of an aperture and a distance from the second laser light source to the astigmatic correction plate in a direction parallel to the optical axis is shorter than a distance from the first laser light source to the astigmatic correction plate.

11 Claims, 12 Drawing Sheets

SEMICONDUCTOR LASER DEVICE, ASTIGMATIC CORRECTION PLATE USED THEREFOR AND METHOD OF ARRANGING THE ASTIGMATIC CORRECTION PLATE

BACKGROUND OF THE INVENTION

1. Field of the Invention

The present invention relates to a semiconductor laser device, an astigmatic correction plate used therefor and a method of arranging the astigmatic correction plate.

2. Description of the Related Art

A typical semiconductor laser has a large number of characteristics, such as compact size, high efficiency, capability of low voltage operation, low power consumption, long life span, capability of high speed modulation and so on, so it is applicable as a light source for optical electronics, such as for optical communications or for reading data from an optical storage medium in various fields. Such a semiconductor laser device emits one kind of a laser beam from one element; however, as a derivative of the device, two-wavelength semiconductor laser devices emitting two kinds of laser beams with different wavelengths from one element have been proposed in, for example, Japanese Unexamined Patent Application Publication No. Hei 10-302289, Japanese Unexamined Patent Application Publication No. Hei 09-283853, Japanese Unexamined Patent Application Publication No. Hei 02-253676, Japanese Unexamined Patent Application Publication No. Sho 56-80195, Japanese Unexamined Patent Application Publication No. Sho 60-164381, Japanese Patent Publication No. 3095036, Japanese Patent Publication No. 3197050 and so on, and some of them are already in practical use.

FIG. 1 shows an example of such conventional two-wavelength semiconductor laser device. In the conventional two-wavelength semiconductor laser device, on a laser diode chip 16 with, for example, a double heterojunction structure, a first laser light source 11 of a light emitting point which emits a laser beam with a predetermined wavelength is arranged, and a second laser light source 12 which emits a laser beam with a different wavelength from that of the laser beam emitted from the first laser light source 11 is arranged at a predetermined distance from the first laser light source 11. In order to correct the astigmatism of the laser beams emitted from the first laser light source 11 and the second laser light source 12, an astigmatic correction plate 13 is arranged so as to intersect diagonally the optical axes of the laser beams.

The astigmatic correction plate 13 is arranged on a backside of a top surface of a so-called slanted cap 18 having an aperture with a predetermined effective diameter. The slanted cap 18 is arranged so as to cover the laser diode chip 16, and thereby a main surface of the astigmatic correction plate 13 intersects diagonally optical axes 15 and 19 of the laser beams emitted from the laser diode chip 16.

In such two-wavelength semiconductor laser device, as shown in FIG. 2, the astigmatic correction plate 13 is arranged in a slanting position, so the optical axes 15 and 19 of the laser beams are shifted due to refraction in the astigmatic correction plate 13. Therefore, the first laser light source 11 is arranged in a position shifted from a center line (CL) of the effective diameter of the aperture on purpose.

On the other hand, in much the way that the position of the first laser light source 11 is shifted, the second laser light source 12 is arranged in a position shifted by a predetermined distance from the first laser light source 11 to a direction in which a distance to the main surface of the astigmatic correction plate 13 becomes longer.

However, in the above, conventional two-wavelength semiconductor laser device, as schematically shown in FIG. 3, there is a problem that, specifically, an emission angle (a region capable of emission) of the laser beam emitted from the second laser light source 12 becomes extremely narrow.

SUMMARY OF THE INVENTION

In view of the foregoing, it is an object of the present invention to provide a semiconductor device capable of increasing an emission angle of a laser beam, an astigmatic correction plate used therefor and a method of arranging the astigmatic correction plate.

A semiconductor laser device emitting two wavelengths different from each other according to the invention comprises: a first laser light source emitting a laser beam with a first wavelength; a second laser light source arranged at a predetermined distance from the first laser light source emitting a laser beam with a second wavelength; and an astigmatic correction plate comprising a light transmitting plate with a predetermined thickness, the astigmatic correction plate being arranged so as to intersect diagonally an optical center line or an optical axis of at least one of the laser beams emitted from the first laser light source and the second laser light source in order to correct the astigmatism of the laser beam, and emitting the laser beam from an aperture with a predetermined effective diameter to outside, wherein the first laser light source and the second laser light source are arranged on both sides of a center line of the effective diameter so as to have different distances to the astigmatic correction plate in a direction parallel to the optical center line or the optical axis.

Another semiconductor laser device emitting two wavelengths different from each other according to the invention comprises: a first laser light source emitting a laser beam with a first wavelength; a second laser light source arranged at a predetermined distance from the first laser light source emitting a laser beam with a second wavelength; and an astigmatic correction plate comprising a light transmitting plate with a predetermined thickness, the astigmatic correction plate being arranged so as to intersect diagonally an optical center line or an optical axis of at least one of the laser beams emitted from the first laser light source and the second laser light source in order to correct the astigmatism of the laser beam, and emitting the laser beam from an aperture with a predetermined effective diameter to outside, wherein the first laser light source is arranged in such a position that an optical center line or an optical axis of the first laser light source almost coincides with a center line of the effective diameter of the astigmatic correction plate, and the second laser light source is arranged so that a distance from the second laser light source to the astigmatic correction plate in a direction parallel to the optical center line or the optical axis is shorter than a distance from the first laser light source to the astigmatic correction plate.

In an astigmatic correction plate used for a semiconductor laser device according to the invention, the semiconductor laser device comprises a first laser light source emitting a laser beam with a first wavelength and a second laser light source arranged at a predetermined distance from the first laser light source emitting a laser beam with a second wavelength, and the astigmatic correction plate, which is arranged so as to intersect diagonally an optical center line or an optical axis of at least one of the laser beams emitted from the first laser light source and the second laser light source in order to correct the astigmatism of the laser beam, and which emits the laser beam from an aperture with a predetermined effective diameter to outside, comprises a light transmitting plate body with a predetermined thickness, wherein the astigmatic correction plate is arranged so that the first laser light source and the second laser light source have different distances to the astigmatic correction plate in a direction parallel to the optical center line or the optical axis, and the first laser light source and the second laser light source are arranged on both sides of a center line of the effective diameter.

In another astigmatic correction plate used for a semiconductor laser device according to the invention, the semiconductor laser device comprises a first laser light source emitting a laser beam with a first wavelength and a second laser light source arranged at a predetermined distance from the first laser light source emitting a laser beam with a second wavelength, and the astigmatic correction plate, which is arranged so as to intersect diagonally an optical center line or an optical axis of at least one of the laser beams emitted from the first laser light source and the second laser light source in order to correct the astigmatism of the laser beam, and which emits the laser beam from an aperture with a predetermined effective diameter to outside, comprises a light transmitting plate body with a predetermined thickness, wherein the astigmatic correction plate is arranged so that an optical center line or an optical axis of the first laser light source almost coincides with a center line of the effective diameter and a distance from the second laser light source to the astigmatic correction plate in a direction parallel to the optical center line or the optical axis is shorter than a distance from the first laser light source to the astigmatic correction plate.

In a method of arranging an astigmatic correction plate according to the invention, the astigmatic correction plate is used for a semiconductor laser device comprising a first laser light source emitting a laser beam with a first wavelength and a second laser light source arranged at a predetermined distance from the first laser light source emitting a laser beam with a second wavelength, and the astigmatic correction plate, which is arranged so as to intersect diagonally an optical center line or an optical axis of at least one of the laser beams emitted from the first laser light source and the second laser light source in order to correct the astigmatism of the laser beam, and which emits the laser beam from an aperture with a predetermined effective diameter to outside, comprises a light transmitting plate body with a predetermined thickness, and the method comprises the step of arranging the astigmatic correction plate so that the first laser light source and the second laser light source have different distances to the astigmatic correction plate in a direction parallel to the optical center line or the optical axis and the first laser light source and the second laser light source are arranged on both sides of a center line of the effective diameter.

In another method of arranging an astigmatic correction plate according to the invention, the astigmatic correction plate is used for a semiconductor laser device comprising a first laser light source emitting a laser beam with a first wavelength and a second laser light source arranged at a predetermined distance from the first laser light source emitting a laser beam with a second wavelength, and the astigmatic correction plate, which is arranged so as to intersect diagonally an optical center line or an optical axis of at least one of the laser beams emitted from the first laser light source and the second laser light source in order to correct the astigmatism of the laser beam, and which emits the laser beam from an aperture with a predetermined effective diameter to outside, comprises a light transmitting plate body with a predetermined thickness, and the method comprises the step of arranging the astigmatic correction plate so that an optical center line or an optical axis of the first laser light source almost coincides with a center line of the effective diameter and a distance from the second laser light source to the astigmatic correction plate in a direction parallel to the optical center line or the optical axis is shorter than a distance from the first laser light source to the astigmatic correction plate.

According to the semiconductor laser device, the astigmatic correction plate used therefor and the method of arranging the astigmatic correction plate of an aspect of the invention, the astigmatic correction plate comprising a light transmitting plate body with a predetermined thickness is arranged so as to intersect diagonally an optical center line or an optical axis of at least one of the laser beams emitted from the first laser light source and the second laser light source in order to correct the astigmatism of the laser beam, and the astigmatic correction plate emits the laser beam from an aperture with a predetermined effective diameter to outside. Further, the astigmatic correction plate is arranged so that the first laser light source and the second laser light source have different distances to the astigmatic correction plate in a direction parallel to the optical center line or the optical axis, and the first laser light source and the second laser light source are arranged on both sides of a center line of the effective diameter. Thereby, an incident angle of the laser beam emitted from the first laser light source and an incident angle of the laser beam emitted from the second laser light source to the astigmatic correction plate can become wider than ever.

According to the semiconductor laser device, the astigmatic correction plate used therefor and the method of arranging the astigmatic correction plate of another aspect of the invention, in the method of arranging the astigmatic correction plate used for the semiconductor laser device comprising a first laser light source emitting a laser beam with a first wavelength and a second laser light source arranged at a predetermined distance from the first laser light source emitting a laser beam with a second wavelength, the astigmatic correction plate comprising a light transmitting plate body with a predetermined thickness is arranged so as to intersect diagonally an optical center line or an optical axis of at least one of the laser beams emitted from the first laser light source and the second laser light source in order to correct the astigmatism of the laser beam, and the astigmatic correction plate emits the laser beam from an aperture with a predetermined effective diameter to outside. Further, the astigmatic correction plate, the first laser light source and the second laser light source are arranged so that an optical center line or an optical axis of the first laser light source almost coincides with a center line of the effective diameter and a distance from the second laser light source to the astigmatic correction plate in a direction parallel to the optical center line or the optical axis is shorter than a distance from the first laser light source to the astigmatic correction plate. Thereby, not only an incident angle of the first laser beam emitted from the first laser light source to the astigmatic correction plate but also, specifically, an incident angle of the second laser beam emitted from the second laser light source to the astigmatic correction plate can become wider than ever.

Other and further objects, features and advantages of the invention will appear more fully from the following description.

DETAILED DESCRIPTION OF THE PREFERRED EMBODIMENTS

Preferred embodiments of the present invention will be described in more detail below referring to the accompanying drawings.

Figure 4:
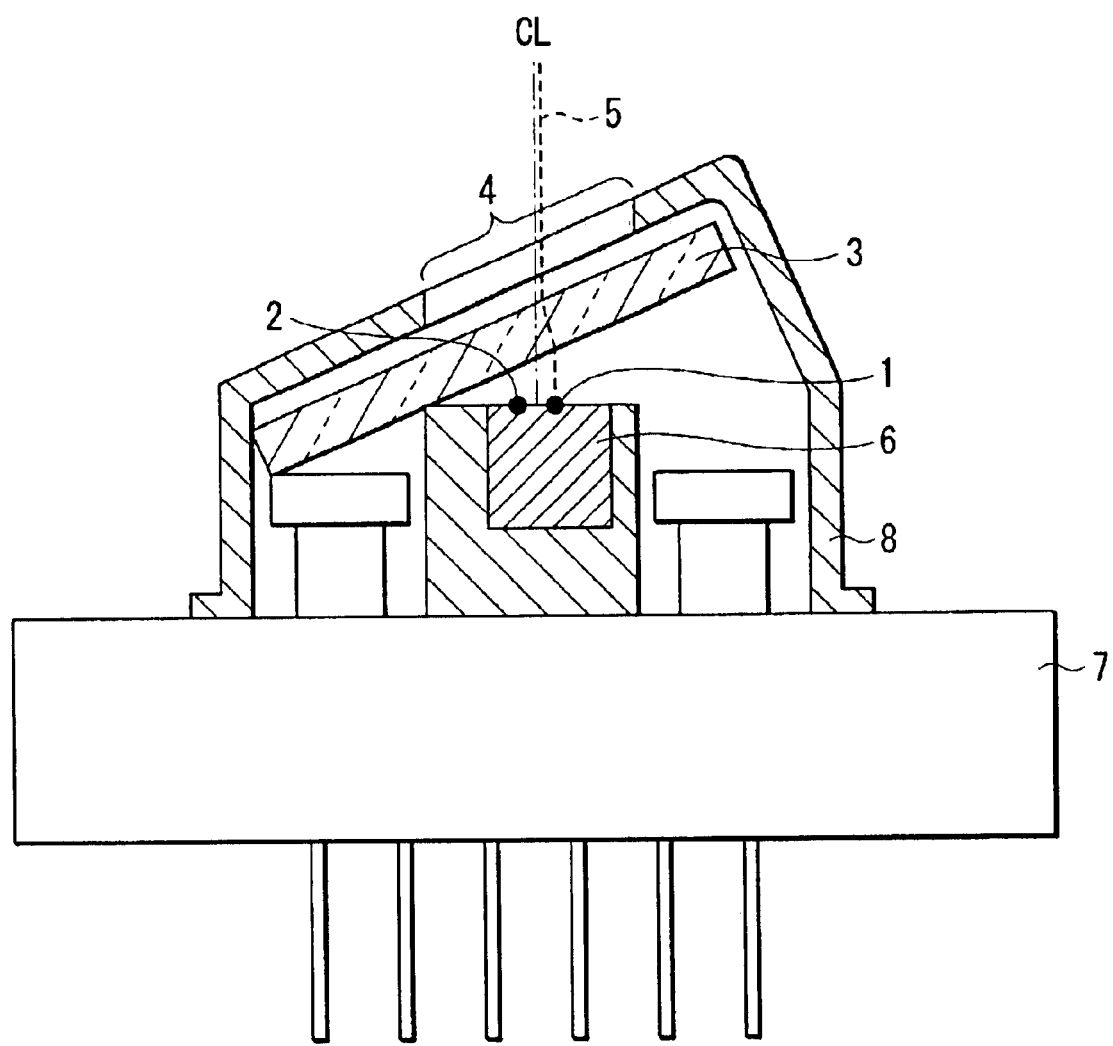
FIG. 4 is a schematic diagram showing a configuration of a two-wavelength semiconductor laser device according to an embodiment of the invention.
Figure 5:
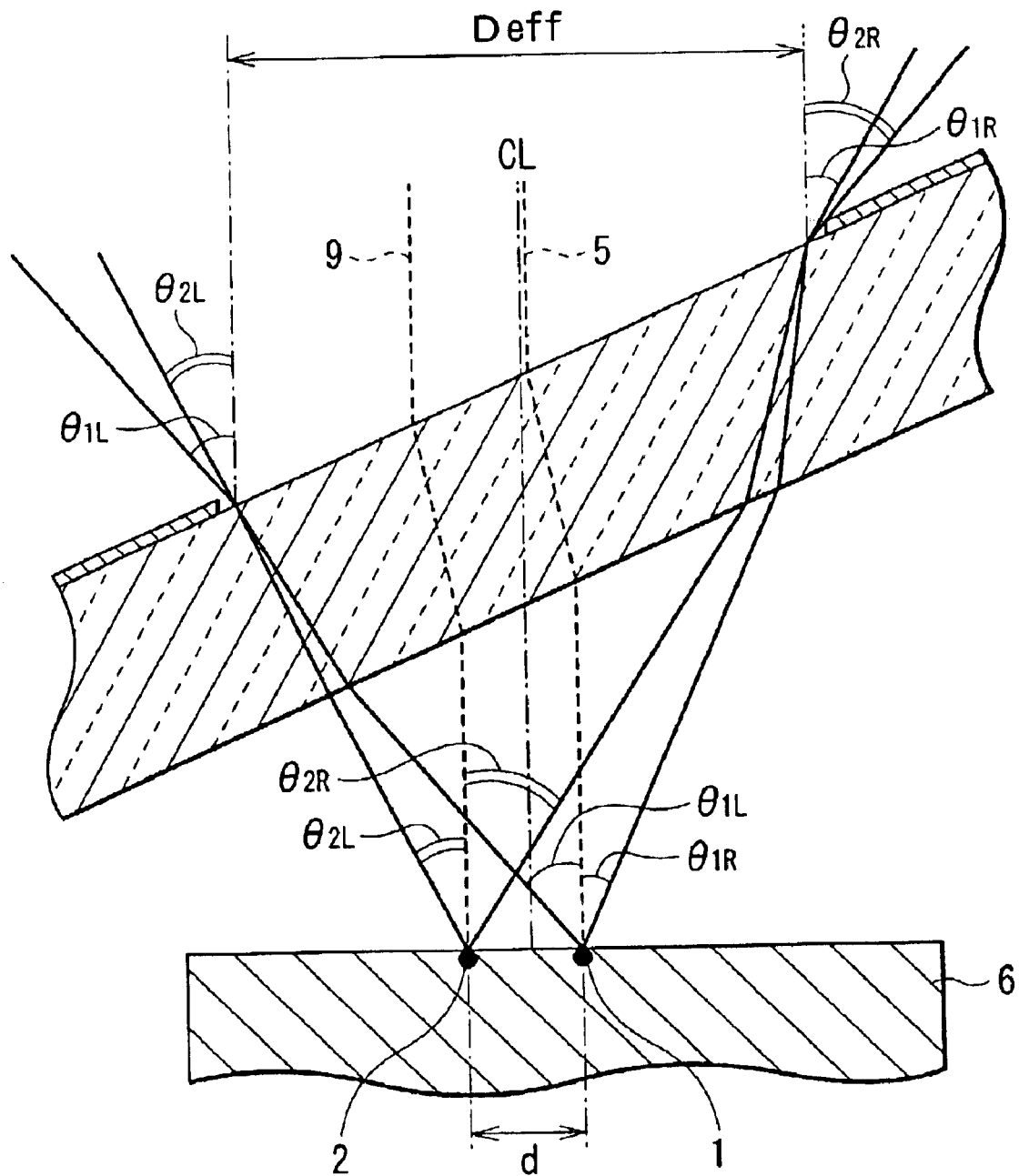
FIG. 5 is a schematic diagram showing an arrangement of a first laser light source and a second laser light source and emission angles of laser beams in the two-wavelength semiconductor laser device.

FIG. 4 shows a configuration of a two-wavelength semiconductor laser device according to an embodiment of the invention. FIG. 5 is a schematic diagram showing an arrangement of a first laser light source and a second light source in the two-wavelength semiconductor laser device according to the embodiment of the invention. In addition, as an astigmatic correction plate and a method of arranging the astigmatic correction plate according to the embodiment of the invention are embodied by operations or actions of the two-wavelength semiconductor laser device, they also will be described below. In the description below, for the sake of simplifying the drawings and the description, a portion in which a typical component may be used, such as a laser diode chip, will be described briefly but not in detail.

The two-wavelength semiconductor laser device comprises a laser light source 1 which emits a first laser beam with a predetermined wavelength, a second laser light source 2 which is arranged at a predetermined distance from the first laser light source 1 and which emits a second laser beam with a different wavelength from that of the first laser beam, an astigmatic correction plate 3 which is arranged so as to intersect diagonally an optical center line (optical axis) 5 of the first laser beam for the purpose of correcting the astigmatism of the first laser beam and the second laser beam and which comprises an optical glass plate with a predetermined thickness, and a slanted cap 8 which supports the astigmatic correction plate 3 on the backside of a slanted top surface, which has an aperture 4 with a predetermined effective diameter (Deff) on the slanted top surface, and which is arranged on a top surface of a header 7, so as to be laid over the laser diode chip 6, without contact with the laser diode chip 6, and so that the first laser beam and the second laser beam can be emitted from the aperture 4 to outside.

On a top surface of the laser diode chip 6, the first laser light source 1 is arranged so that the optical axis 5 of the first laser light source 1 coincides with a center line (CL) of the effective diameter of the aperture 4 in the slanted cap 8, and the second laser light source 2 is arranged in a position where a distance from the second laser light source 2 to the astigmatic correction plate 3 in a vertical direction in FIG. 4 (that is, in a direction parallel to an optical axis of a laser beam) is shorter than a distance from the first laser light source 1 to the astigmatic correction plate 3 at a predetermined distance d from the first laser light source 1 in a lateral direction in FIG. 4 (that is, in a direction orthogonal to the optical axis of the laser beam). The first laser light source 1 and the second laser light source 2 are arranged on the laser diode chip 6 as so-called point sources (light emitting points) with a predetermined minute diameter, and the first laser light source 1 and the second laser light source 2 emit laser beams with wavelengths different from each other throughout their respective, predetermined angle regions.

More specifically, in the two-wavelength semiconductor laser device, a Si sub-mount including the laser diode chip 6 is mounted on a prism portion of the header 7 made of a metal with an electrically conductive adhesive (not shown). An Au (gold) bonding wire (not shown) is laid between the laser diode chip 6 and the header 7. The slanted cap 8 made of a metal with the above-described structure is fixed on the top surface of the header 7 by, for example, welding or the like.

In order to correct the astigmatic aberration of laser beams emitted from the laser diode chip 6, the astigmatic correction plate 3 is arranged so as to be slanted at a predetermined angle with respect to the optical axis (the optical center line) 5 of the laser beam. However, by refraction in the astigmatic correction plate 3 comprising an optical glass plate, when light emitting points of the first laser beam and the second laser beam are emitted from the two-wavelength semiconductor laser device are, they shifted from the light emitting points on the laser diode chip 6. Therefore, in order to cancel out shifts of the points, the first laser light source 1 and the second laser light source 2, which are light emitting points on the laser diode chip, 6 are set in shifted positions in advance.

In the two-wavelength semiconductor laser device, as schematically shown in FIG. 5, the first laser light source 1 is arranged in such a position that the optical axis 5 of the first laser beam emitted from the astigmatic correction plate 3 coincides with the center line (CL) of the effective diameter of the aperture 4 in the slanted cap 8. In the first laser light source 1, an effective lighting angle (maximum incident angle) of the first laser beam which can pass through the effective diameter of the aperture 4 in the slanted cap 8 is θ1L to the left and θ1R to the right, that is, θ1L+74 1R as a range (the sum of the angle to the left and the angle to the right), assuming that the center line of the laser beam emitted from the first laser light source 1 is a reference (0 degrees). Needless to say, the angle is optically equal to an emission angle of the first laser beam emitted from the astigmatic correction plate 3 to outside.

The second laser light source 2 is arranged in a position at a predetermined distance d from the laser light source 1 in a leftward direction in FIG. 4. In other words, the second laser light source 2 is arranged at the predetermined distance d from the laser light source 1 in such a direction that a distance between the second light source 2 and the astigmatic correction plate 3 in a direction parallel to the axis of the first laser beam or the second laser beam (that is, in a vertical direction in FIG. 5) is shorter than a distance between the first light source 1 and the astigmatic correction plate 3. The position of the second laser light source 2 is different from that in a conventional two-wavelength semiconductor laser device (the direction where the second laser light source 2 is arranged is opposite). In the second laser light source 2, an effective lighting angle of the second laser beam which can pass through the effective diameter Deff of the aperture 4 in the slanted cap 8 is θ2L to the left and θ2R to the right, that is, θ2L□θ2R as a range, assuming that an optical axis 9 of the second laser beam emitted from the second laser light source 2 is a reference. Needless to say, the angle is optically equal to an emission angle of the second laser beam emitted from the astigmatic correction plate 3 to outside.

Figure 1:
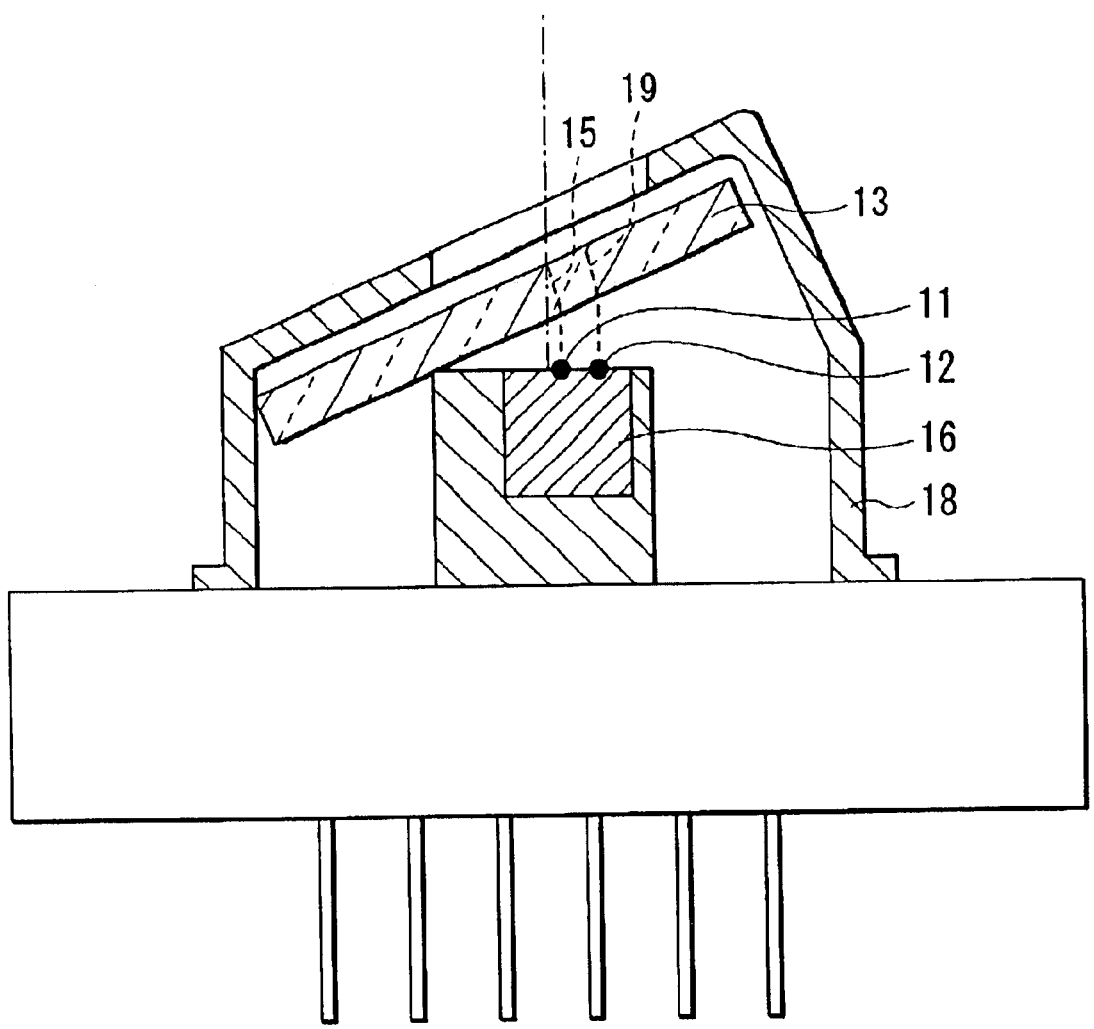
FIG. 1 is a diagram of an example of a conventional two-wavelength semiconductor laser device.
Figure 2:
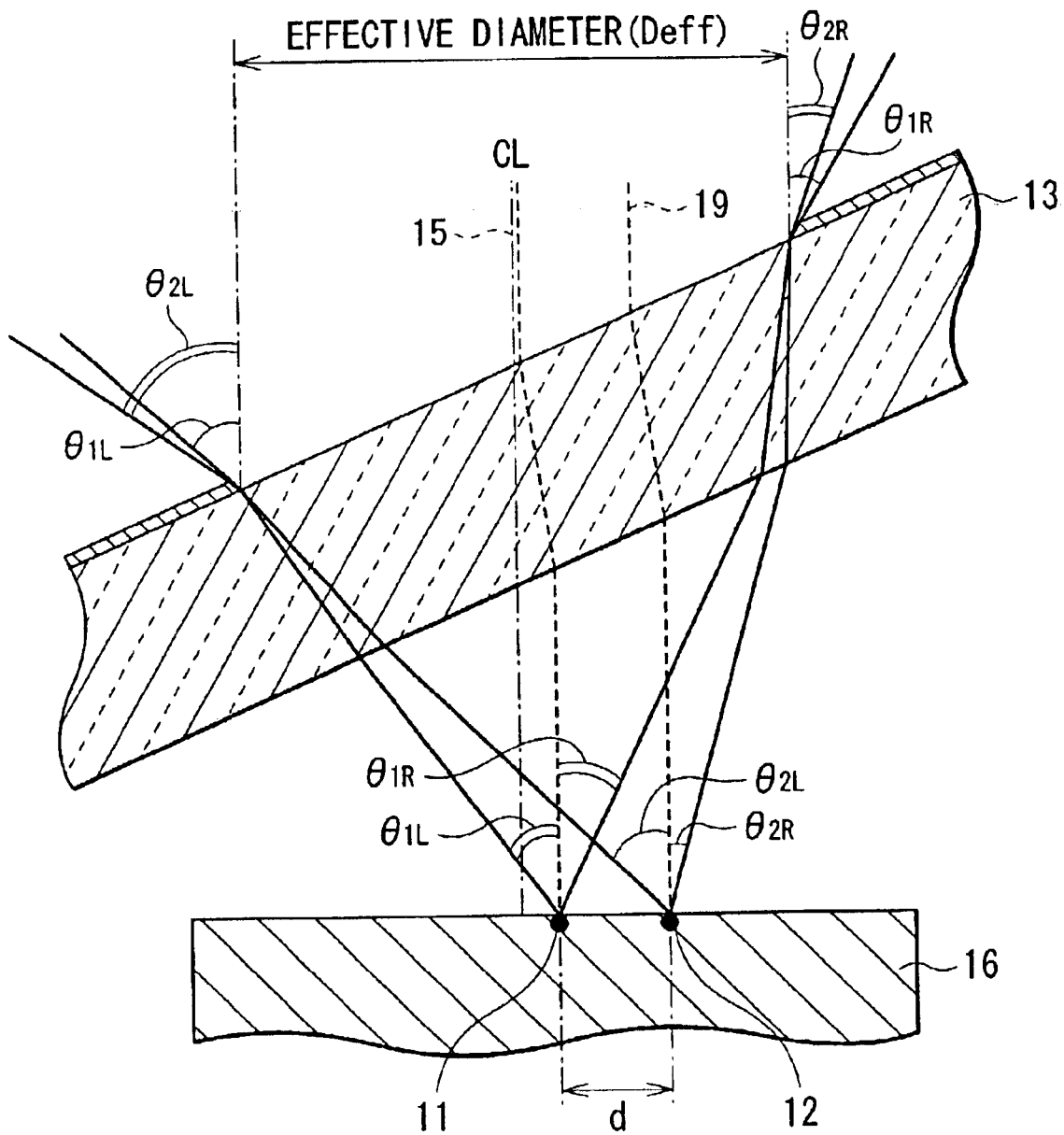
FIG. 2 is a schematic diagram showing an arrangement of a first laser light source and a second laser light source and emission angles of laser beams in the conventional two-wavelength semiconductor laser device.
Figure 3:
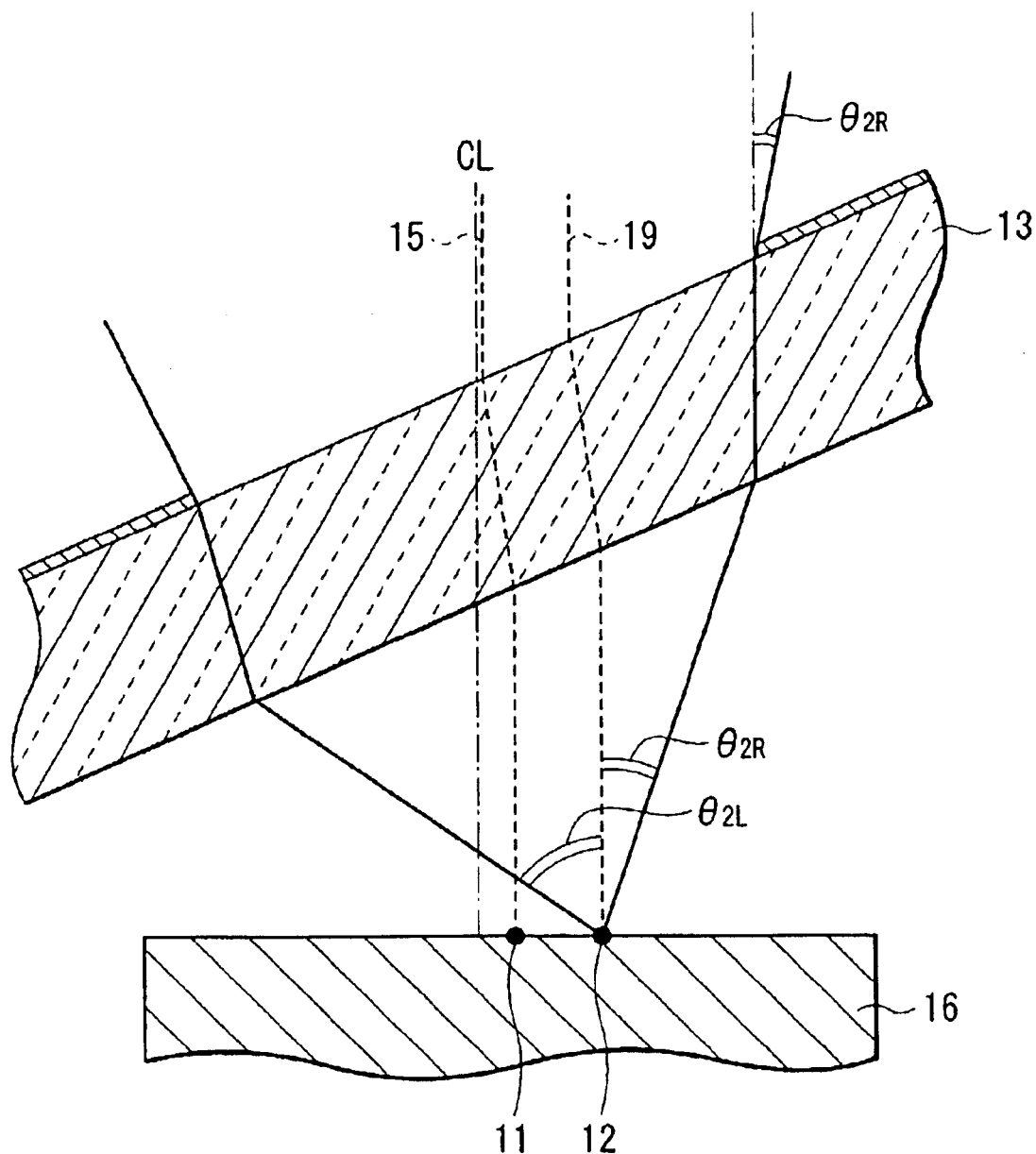
FIG. 3 is a diagram showing an example of a state in which an effective lighting angle, that is, an emission angle of a laser beam emitted from the second laser light source in the conventional two-wavelength semiconductor laser device becomes extremely narrow.

An effective emitting angle (=emission angle) of the second laser beam in the second laser light source 2 is wider than an effective lighting angle (=emission angle) of a second laser beam in the conventional two-wavelength semiconductor laser device shown in FIG. 3. Specifically, while the angle θ2L is restrained from being decreased, the angle θ2R can be remarkably increased.

Next, an effect of the two-wavelength semiconductor laser device according to the embodiment will be described below.

Figure 6:
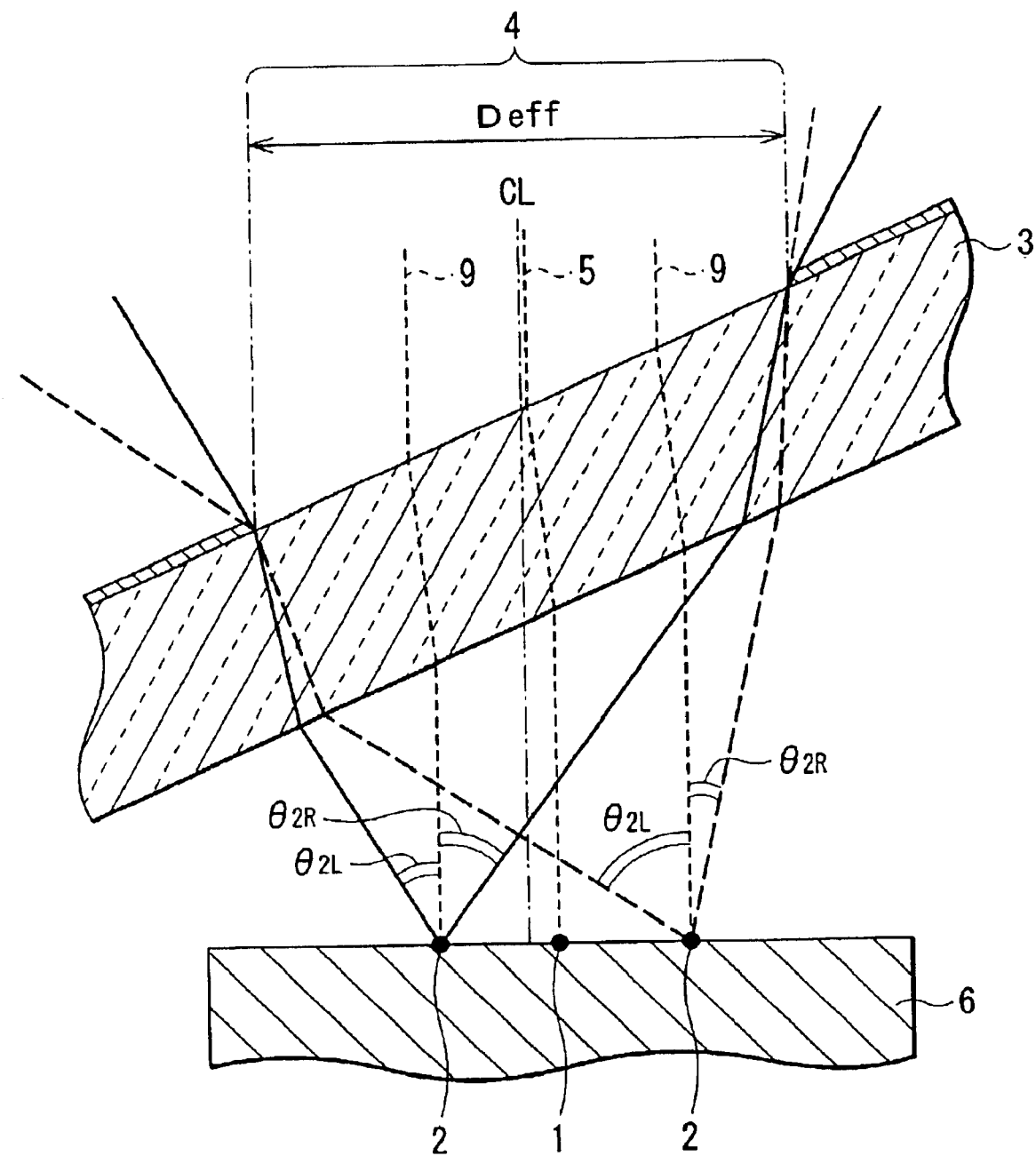
FIG. 6 is a schematic diagram showing an effect of increasing an emission angle of a laser beam in the two-wavelength semiconductor laser device together with that in the conventional two-wavelength semiconductor laser device as a comparison.

Referring to FIG. 6, in the conventional two-wavelength semiconductor laser device, the second laser light source 2 is arranged to the right of the first laser light source 1, so, as indicated by a broken line, in the second laser beam emitted from the second laser light source 2, specifically, the angle θ2R is extremely narrow (the emission angle is small). In this case, in expectation that the position of the optical axis 5 will be shifted in a horizontal direction when the first laser beam emitted from the first laser light source 1 is refracted in the astigmatic correction plate 3 to emit to outside, the first laser light source 1 is arranged in a position shifted to the right from the center line (CL) of the effective diameter of the aperture 4 in FIG. 3 in advance. Therefore, when the second laser light source 2 is arranged further to the right at the predetermined distance d from the first laser light source 1, the second laser light source 2 is positioned further to the right than the first laser light source 1, which is already shifted to the right. Thereby, it is considered that the angle θ2R of the second laser beam is forced to be narrower.

However, in the two-wavelength semiconductor laser device according to the embodiment, as indicated by a solid line, the second laser light source 2 is arranged to the left of the first laser light source 1 which is shifted to the right of the center line (CL) of the effective diameter of the aperture 4, so the angle θ2R can be greatly increased, and the angle θ2L can be ensured to be sufficiently large.

Figure 7A:
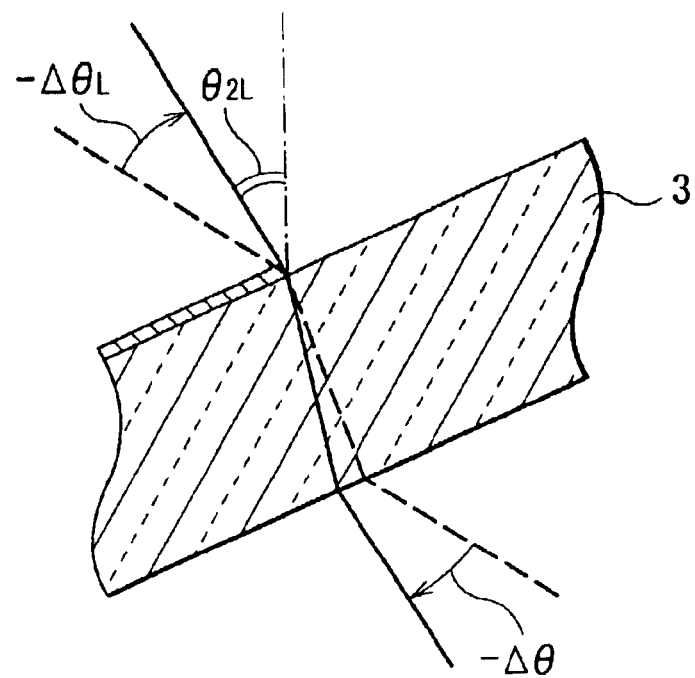
FIGS. 7A and 7B are diagrams for schematically explaining a decreased portion of an angle $\theta 2L$ ($-\Delta\theta$) and a greatly increased portion of an angle $\theta 2R$ ($+\Delta\theta$), respectively.
Figure 7B:
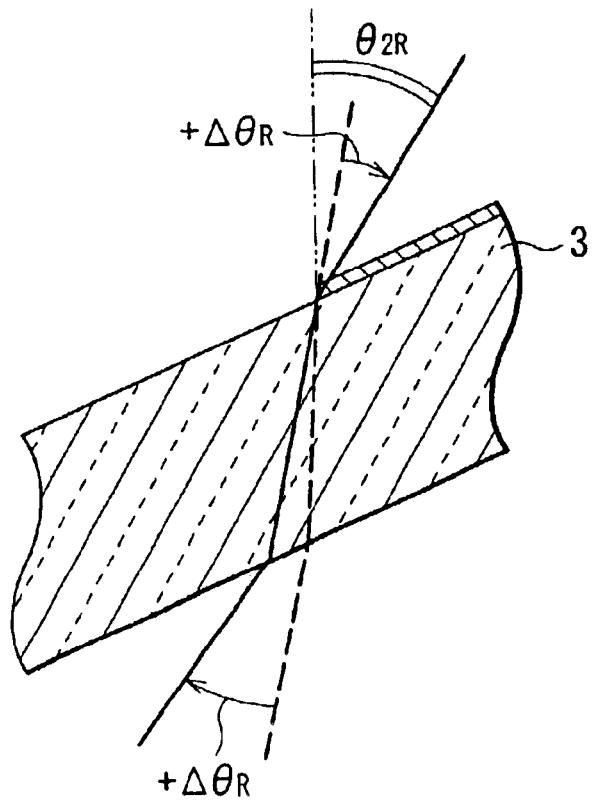

In this case, as schematically shown in FIGS. 7A and 7B, the angle θ2L is decreased more than that in the case where the second laser light source 2 is arranged to the right of the first laser light source 1 (refer to FIG. 7A). However, as the astigmatic correction plate 3 is arranged in a slanting position, compared with a greatly increased portion (+ΔθR; refer to FIG. 7B) of the angle θ2R, a decreased portion (−ΔθL) of the angle θ2L is small. Therefore, in consideration of the increased portion (+ΔθR) of the angle θ2R and the decreased portion (−ΔθL) of the angle θ2L, in the two-wavelength semiconductor laser device according to the embodiment, the angle θ2L+θ2R can be much larger than that in the conventional two-wavelength semiconductor laser device.

Moreover, in consideration of only angle θ2R, in the conventional two-wavelength semiconductor laser device, the angle θ2R is extremely narrow, so a practical emission angle cannot be obtained. On the other hand, in the two-wavelength semiconductor laser device according to the embodiment, a sufficiently wide and practical emission angle of θ2R can be obtained. Further, regarding the angle θ2L, in the two-wavelength semiconductor laser device according to the embodiment, although the emission angle is decreased to some degree, a sufficiently wide emission angle for practical use can be obtained.

Figure 8:
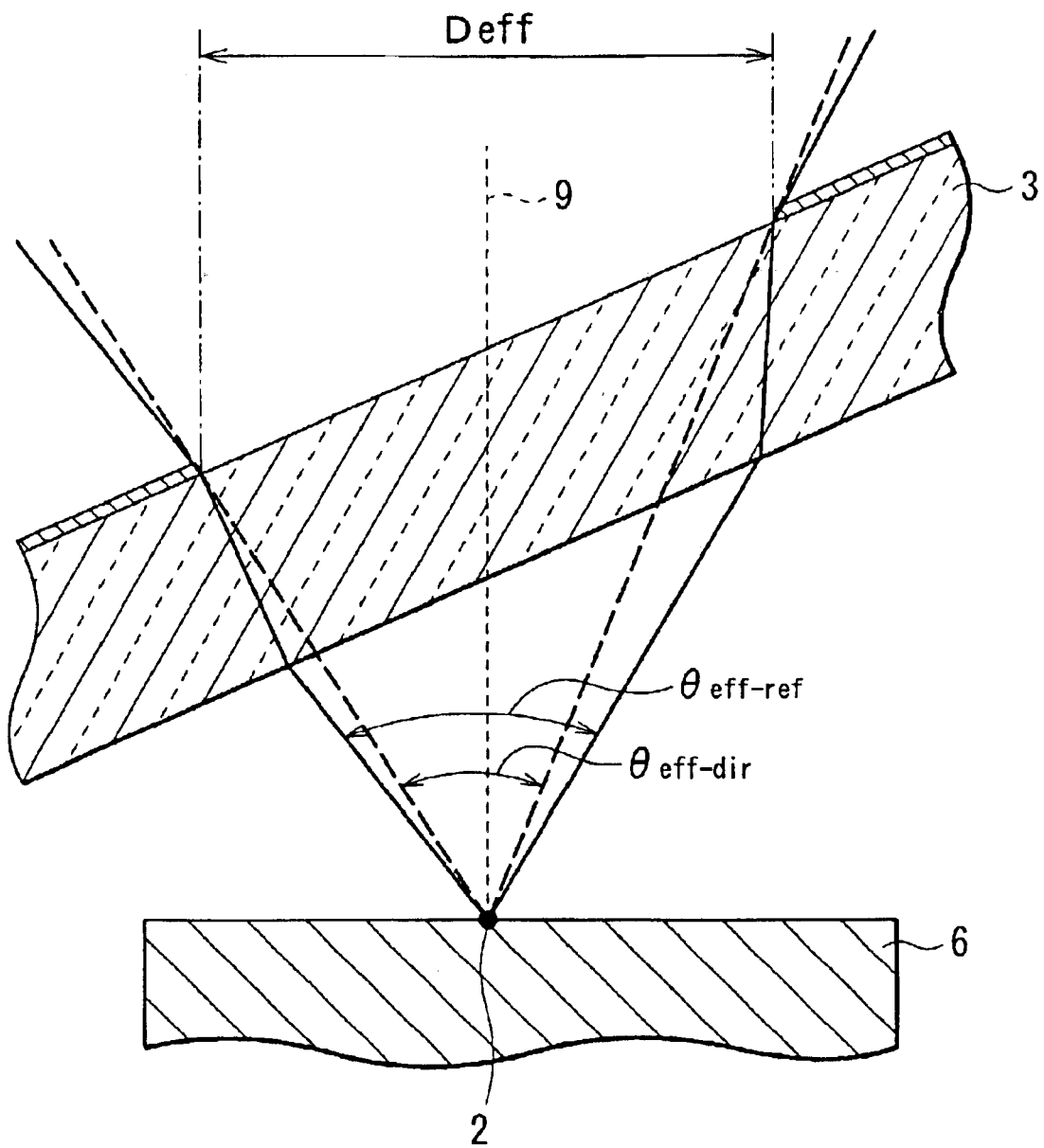
FIG. 8 is a schematic diagram showing that when an effective lighting angle (maximum incident angle) $\theta$eff-dir of a laser beam which is not refracted and travels in a straight line (indicated by a broken line) is compared with an effective lighting angle $\theta$eff-ref of an laser beam which is refracted (indicated by a solid line), the effective lighting angle $\theta$eff-ref is larger.

As schematically shown in FIG. 8, compared with an effective lighting angle (maximum incident angle) θeff-dir of a laser beam when the laser beam travels in a straight line without refracting (indicated by a broken line in FIG. 8), even though the effective diameter of the aperture 4 in the slanted cap 8 is the same, by refraction of the laser beam in the astigmatic correction plate 3, an effective lighting angle θeff-ref of the laser beam emitted from the laser light source when the laser beam is refracted (indicated by a solid line in FIG. 8) can be larger (θeff-dir<θeff-ref), so the efficiency of use (lighting efficiency) of the laser beam emitted from the second laser light source 2 can be further improved, and the emission angle optically equal to the effective lighting angle can be increased.

Figure 9:
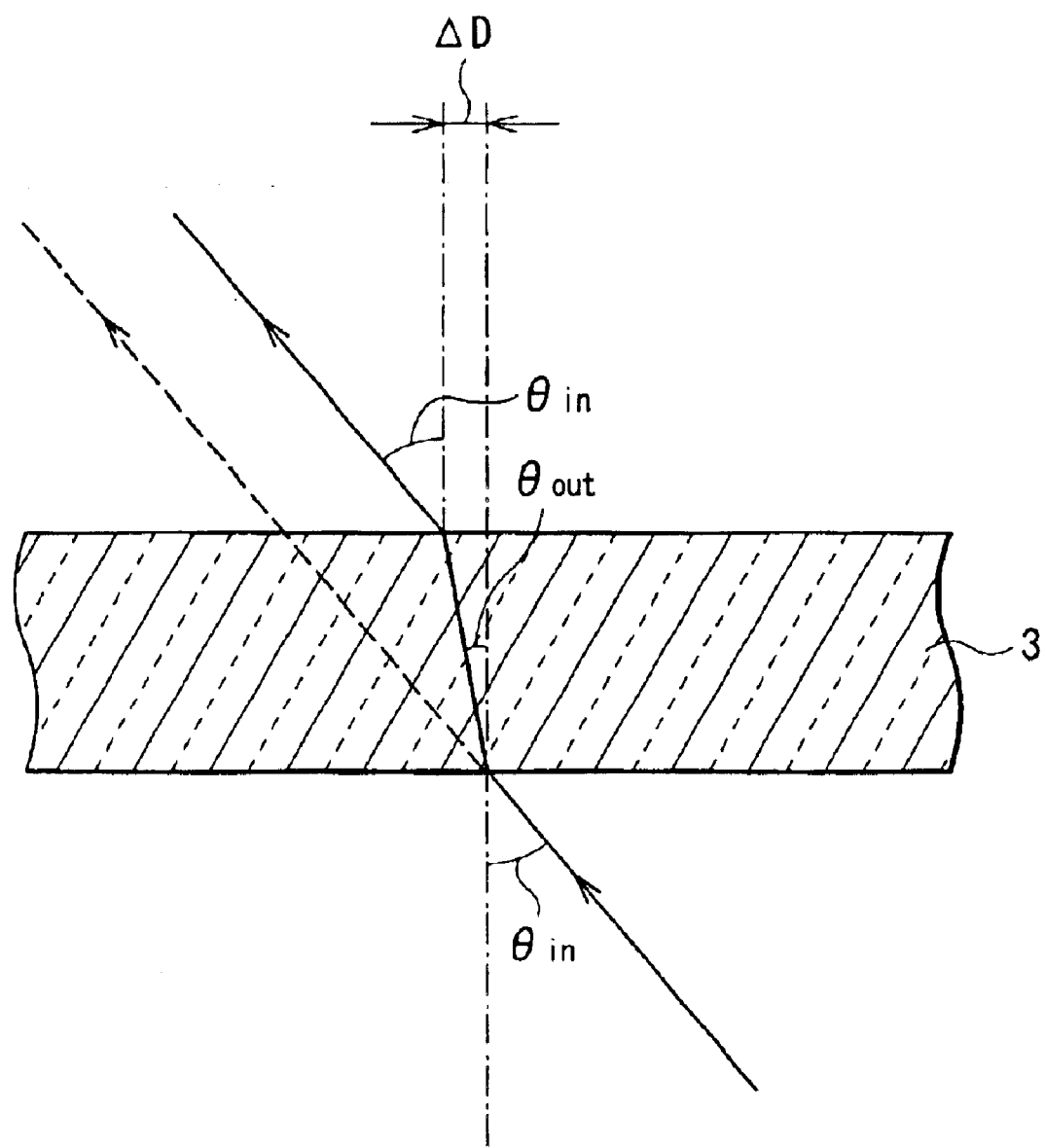
FIG. 9 is a schematic diagram showing a substantial lighting area of an aperture and an effective lighting angle by refraction of a laser beam in an astigmatic correction plate and an effect of increasing an emission angle.

More specifically, as schematically shown in FIG. 9, an increase in the emission angle by such refraction corresponds to an angle which can be obtained by extending the effective diameter Deff of the aperture 4 by ΔD in a horizontal direction. In other words, where an incident angle of the laser beam with respect to an interface on the bottom side of the astigmatic correction plate 3 is θin, an emitting angle from the interface to the inside of the astigmatic correction plate 3 is θout, a refractive index is n, and the thickness of the astigmatic correction plate 3 is t, an equation of ΔD=t(sin θin−sin θout) holds. In this case, by an equation for the refractive index, an equation of sin θin/sin θout=n holds, so an equation of ΔD=t(1−1/n)sin θin holds. As an example, when ΔD in the case of θin=10 degrees and ΔD in the case of θin=60 degrees are calculated, ΔD=0.17t in the case of θin=10 degrees and ΔD=0.87t in the case of θin=60 degrees. It is clear that a ratio of the case of θin=60 degrees to the case of θin=10 degrees is 0.87t/0.17t=5.11, that is, ΔD in the case of θin=60 degrees is approximately five times larger than ΔD in the case of θin=10 degrees. Thus, the larger the incident angle θin of the laser beam with respect to the astigmatic correction plate 3 is, the more an effect of increasing ΔD is increased, thereby resulting in a larger effect of increasing the emission angle θout.

Therefore, in the two-wavelength semiconductor laser device according to the embodiment, the astigmatic correction plate 3 is arranged in a slanting position, so wherever the second laser light source 2 is arranged by the use of a characteristic that the incident angle θ2R of the laser beam with respect to the astigmatic correction plate 3 is larger than the incident angle θ2L, the emission angle (θ2L+θ2R; which is optically equal to the effective lighting angle as described above) can be larger than that in the conventional two-wavelength semiconductor laser device.

Figure 10:
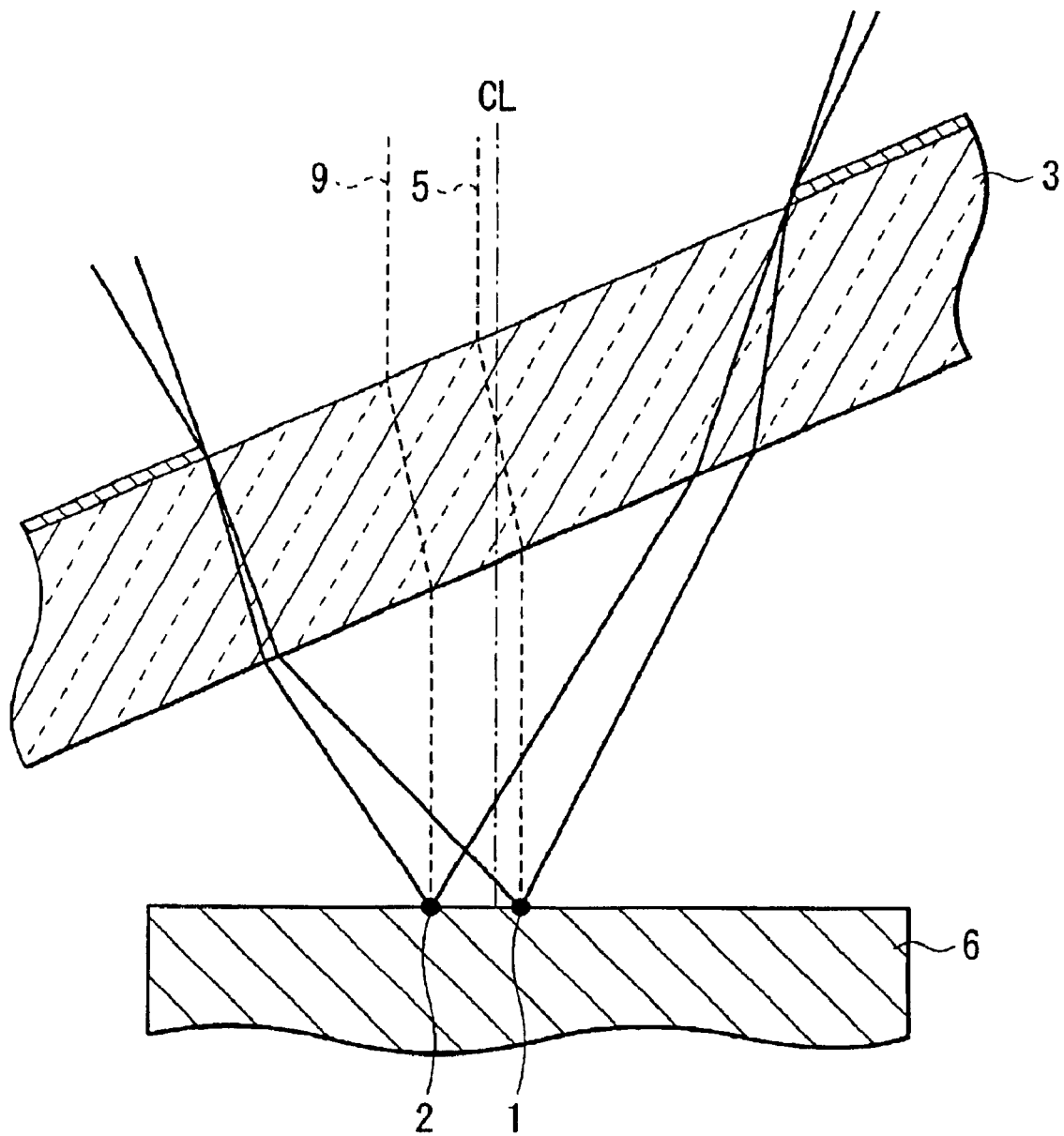
FIG. 10 is a schematic diagram showing a variation of the arrangement of the first laser light source and the second laser light source in the two-wavelength semiconductor laser device.

In the above description, the first laser light source 1 is shifted so that the optical axis of the first laser beam refracted in the astigmatic correction plate 3 coincides with the center line of the effective diameter of the aperture 4. Alternatively, like an example shown in FIG. 10, while the first laser light source 1 is arranged at a small distance from the center line (CL) of the effective diameter of the aperture 4 to the right in FIG. 10, the second laser light source 2 is arranged at a predetermined distance d from the first laser light source 1 to the left, and, thereby, the first laser light source 1 and the second laser light source 2 may be arranged on the right side and the left side of the center line (CL) of the effective diameter of the aperture 4, respectively.

Figure 11:
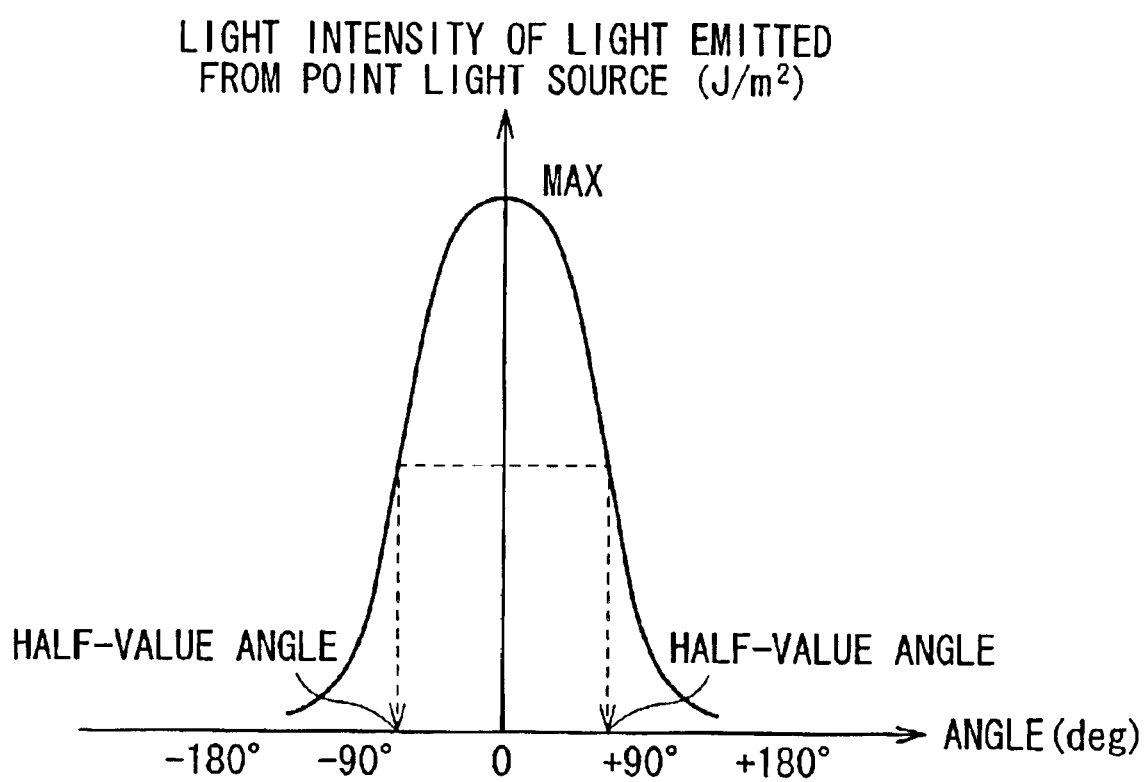
FIG. 11 is an angle-light intensity curve of a second laser beam.

Moreover, the specifications, such as the effective diameter of the aperture 4, a height where the astigmatic correction plate 3 is arranged and a refractive index of the astigmatic correction plate 3, may be set, if necessary, in response to a required emission angle or wavelengths of the first laser beam and the second laser beam emitted. For example, in the case where an angle-light intensity curve of the second laser beam emitted from the second laser light source 2 which is a point light source to its surroundings is as shown in FIG. 11, in order to introduce the laser beam within a range of a half-value angle out of the entire emission angle and emit the laser beam from the aperture 4, the positions of the first laser light source 1 and the second laser light source 2, the effective diameter of the aperture 4 and so on may be set so as to obtain a lighting angle and an emission angle for the half-value angle.

Figure 12A:
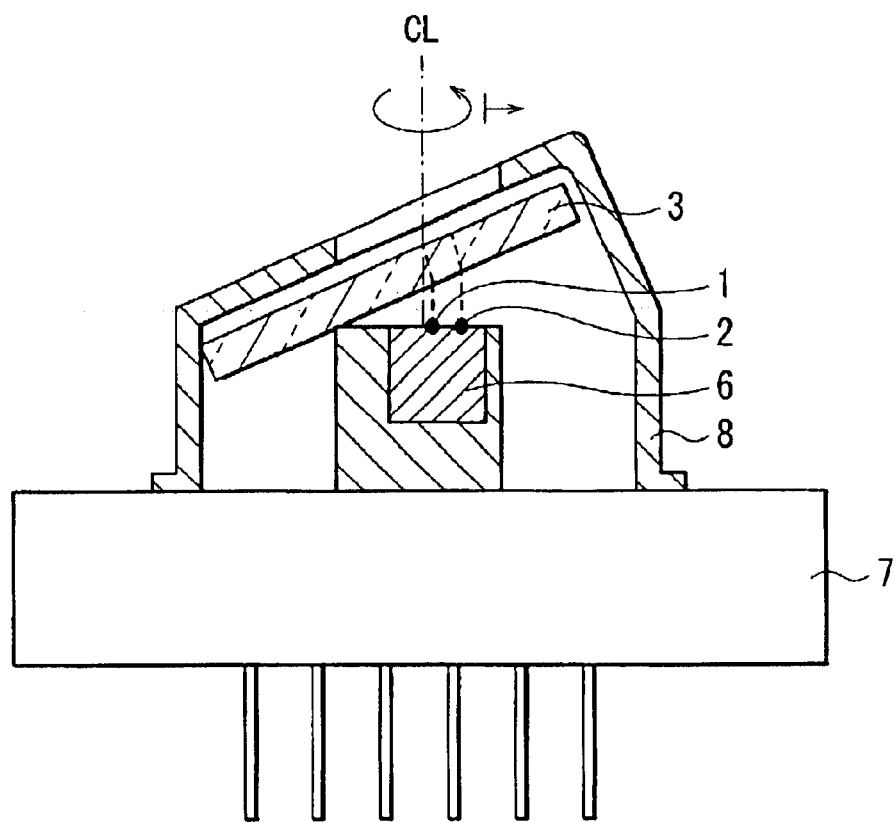
FIGS. 12A and 12B are diagrams showing an example of a technique to implement most easily implement the two-wavelength semiconductor laser device, an astigmatic correction plate used therefor, and a method of arranging the astigmatic correction plate.
Figure 12B:
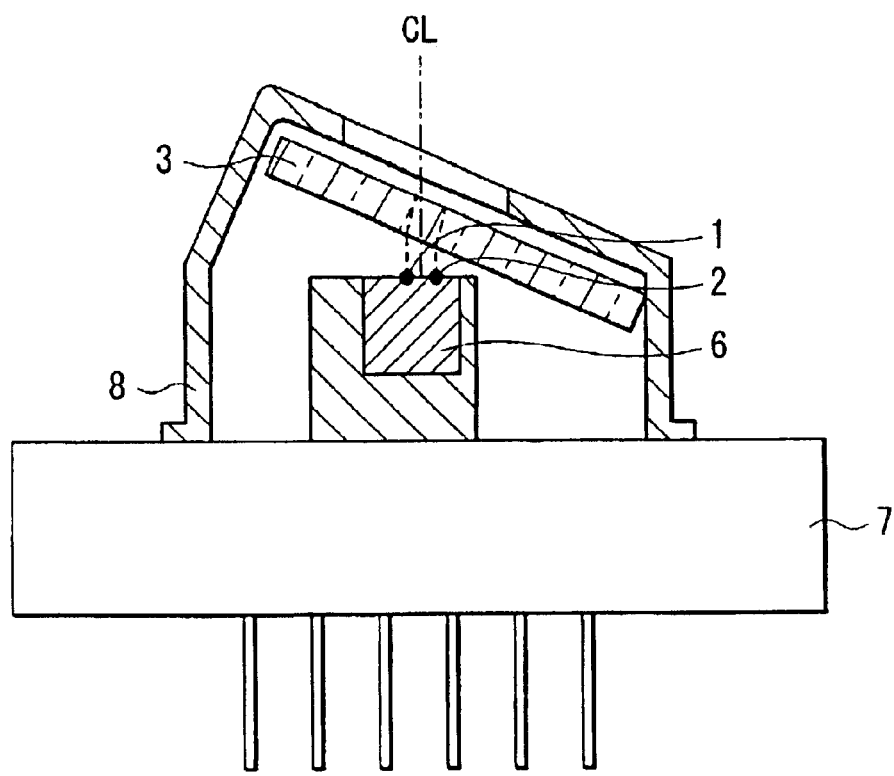

As an easiest technique to implement the above-described, two-wavelength, semiconductor laser device according to the embodiment, the astigmatic correction plate 3 used therefor and a method of arranging the astigmatic correction plate 3, as shown in FIGS. 12A and 12B, the slanted cap 8 used in the conventional and the typical two-wavelength semiconductor laser device (refer to FIG. 12A) is rotated 180 degrees with respect to the laser diode chip 6 and is slightly moved in parallel in a horizontal direction, and thereby the astigmatic correction plate 3 can be slanted in the opposite direction of the conventional one (refer to FIG. 12B). Thus, without changing any other parts, the emission angle of the second laser beam can be increased extremely easily. However, in this case, there is no change in the specifications of the conventional two-wavelength semiconductor laser device, except that the astigmatic correction plate 3 is slanted in the opposite direction of the conventional one, so it is more preferable to further optimize the position of the first laser light source 1 and the second laser light source 2 so as to comply with the optimum conditions for the state in which the astigmatic correction plate 3 is slanted in the opposite direction of the conventional one.

The invention is applicable to various modifications within the scope of the invention. For example, a third laser light source may be added according to the same method as the method of arranging the second laser light source 2.

As described above, according to the semiconductor laser device, the astigmatic correction plate used therefor and the method of arranging the astigmatic correction plate of an aspect of the invention, the astigmatic correction plate comprising a light transmitting plate body with a predetermined thickness is arranged so as to intersect diagonally an optical center line or an optical axis of at least one of the laser beams emitted from the first laser light source and the second laser light source in order to correct the astigmatism of the laser beam, and the astigmatic correction plate emits the laser beam from an aperture with a predetermined effective diameter to outside. Further, the astigmatic correction plate is arranged so that the first laser light source and the second laser light source have different distances to the astigmatic correction plate in a direction parallel to the optical center line or the optical axis, and the first laser light source and the second laser light source are arranged on both sides of a center line of the effective diameter. Thereby, the incident angle of the laser beam emitted from the first laser light source and the incident angle of the laser beam emitted from the second laser light source to the astigmatic correction plate can become wider than ever, and the emission angles of the laser beams can be increased.

According to the semiconductor laser device, the astigmatic correction plate and a method of arranging the astigmatic correction plate of another aspect of the invention, in the method of arranging the astigmatic correction plate used for the semiconductor laser device comprising a first laser light source emitting a laser beam with a first wavelength and a second laser light source arranged at a predetermined distance from the first laser light source emitting a laser beam with a second wavelength, the astigmatic correction plate comprising a light transmitting plate body with a predetermined thickness is arranged so as to intersect diagonally an optical center line or an optical axis of at least one of the laser beams emitted from the first laser light source and the second laser light source in order to correct the astigmatism of the laser beam, and the astigmatic correction plate emits the laser beam from an aperture with a predetermined effective diameter to outside. Further, the astigmatic correction plate, the first laser light source and the second laser light source are arranged so that an optical center line or an optical axis of the first laser light source almost coincides with a center line of the effective diameter, and a distance from the second laser light source to the astigmatic correction plate in a direction parallel to the optical center line or the optical axis is shorter than a distance from the first laser light source to the astigmatic correction plate. Thereby, not only the incident angle of the first laser beam emitted from the first laser light source to the astigmatic correction plate but also, specifically, the incident angle of the second laser beam emitted from the second laser light source to the astigmatic correction plate can become wider than ever, and the emission angles of the laser beams can be increased.

Obviously, many modifications and variations of the present invention are possible in the light of the above teachings. It is therefore to be understood that within the scope of the appended claims, the invention may be practiced otherwise than as specifically described.

What is claimed is:

1. A semiconductor laser device emitting two wavelengths different from each other, comprising:

a laser diode chip having a first laser light source and a second laser light source, said first laser light source emitting a first laser beam along a first optical axis at a first wavelength and said second laser light source emitting a second laser beam along a second optical axis at a second wavelength;

a slanted cap having an aperture, said aperture having a predetermined effective diameter, said first and second laser beams being emitted through said aperture, an optical center line of said predetermined effective diameter extending from said laser diode chip through said aperture, said second laser light source being closer to said optical center line than to said first laser light source, said optical center line being parallel to said first and second optical axes; and an astigmatic correction plate, said second laser light source being closer to said astigmatic correction plate than said first laser light source, said astigmatic correction plate shifting said second optical axis away from said optical center line.

2. A semiconductor laser device according to claim 1, wherein said first and second optical axes within said astigmatic correction plate are shifted in the same direction, said first and second optical axes outside said astigmatic correction plate being parallel to said optical center line.

3. A semiconductor laser device according to claim 1, wherein the distance of said first laser light source to said optical center line is less than the distance of said second laser light source to said optical center line.

4. A semiconductor laser device according to claim 1, wherein said first laser light source is arranged at a predetermined distance from said second laser light source.

5. An astigmatic correction plate used for a semiconductor laser device, the semiconductor device including a first laser light source that emits a first laser beam along a first optical axis at a first wavelength and a second laser light source that emits a second laser beam along said second optical axis at a second wavelength, said first and second laser beams being emitted through an aperture of a slanted cap, said aperture having a predetermined effective diameter, the astigmatic correction plate comprising:

a light transmitting plate body, said first laser light source being farther from said light transmitting plate body than said second laser light source, wherein:

said first and second optical axes within said light transmitting plate body are shifted in the same direction, said light transmitting plate body shifting said second optical axis away from said optical center line of said predetermined effective diameter, and said first and second optical axes outside said light transmitting plate body are parallel to said optical center line.

6. An astigmatic correction plate according to claim 5, wherein said second laser light source is closer to said optical center line than to said first laser light source.

7. An astigmatic correction plate according to claim 5, wherein said first laser light source is arranged at a predetermined distance from said second laser light source.

8. A method of arranging an astigmatic correction plate used for a semiconductor laser device, the semiconductor device including a first laser light source that emits a first laser beam along a first optical axis at a first wavelength and a second laser light source that emits a second laser beam along said second optical axis at a second wavelength, said first and second laser beams being emitted through an aperture of a slanted cap, said aperture having a predetermined effective diameter, the method comprising the step of:

arranging an astigmatic correction plate so that said first laser light source is farther from said astigmatic correction plate than said second laser light source, wherein:

said first and second optical axes within said astigmatic correction plate are shifted in the same direction, said astigmatic correction plate shifting said second optical axis away from said optical center line of said predetermined effective diameter, and said first and second optical axes outside said astigmatic correction plate are parallel to said optical center line.

9. A method according to claim 8, wherein said second laser light source is closer to said optical center line than to said first laser light source.

10. A method according to claim 9, wherein the distance of said first laser light source to said optical center line is less than the distance of said second laser light source to said optical center line.

11. A method according to claim 8, wherein said first laser light source is arranged at a predetermined distance from said second laser light source.

* * * * *